United States Patent
Lin et al.

(10) Patent No.: US 9,924,608 B2
(45) Date of Patent: Mar. 20, 2018

(54) CIRCUIT BOARD ASSEMBLY

(71) Applicant: PEGATRON CORPORATION, Taipei (TW)

(72) Inventors: Yao-Zheng Lin, Taipei (TW); Yu-Chun Chang, Taipei (TW)

(73) Assignee: PEGATRON CORPORATION, Taipei (TW)

(*) Notice: Subject to any disclaimer, the term of this patent is extended or adjusted under 35 U.S.C. 154(b) by 0 days.

(21) Appl. No.: 15/284,690

(22) Filed: Oct. 4, 2016

(65) Prior Publication Data
US 2017/0202100 A1    Jul. 13, 2017

(30) Foreign Application Priority Data
Jan. 8, 2016   (TW) .............................. 105100531 A

(51) Int. Cl.
*H05K 1/14*   (2006.01)
*H05K 7/14*   (2006.01)
*H05K 1/02*   (2006.01)
*H05K 1/11*   (2006.01)
*H05K 9/00*   (2006.01)

(52) U.S. Cl.
CPC ......... *H05K 7/1439* (2013.01); *H05K 1/0216* (2013.01); *H05K 1/111* (2013.01); *H05K 1/141* (2013.01); *H05K 9/006* (2013.01); *H05K 9/0015* (2013.01); *H05K 2201/0707* (2013.01)

(58) Field of Classification Search
CPC .... H05K 1/0216; H05K 1/141; H05K 7/1439; H05K 9/0024; H05K 9/0009; H05K 9/0016; H05K 9/0018; H05K 9/0032; H05K 9/0058; H05K 9/0054; H05K 1/144; H05K 1/145
See application file for complete search history.

(56) References Cited

U.S. PATENT DOCUMENTS

| 4,697,044 | A | * | 9/1987 | Ishikawa | H05K 9/006 174/372 |
| 5,166,609 | A | * | 11/1992 | Cole | G01R 1/0433 324/537 |
| 5,612,512 | A | * | 3/1997 | Wakamatsu | H05K 1/0243 174/257 |

(Continued)

FOREIGN PATENT DOCUMENTS

| CN | 201623957 U | 11/2010 |
| TW | M389345 U1 | 9/2010 |
| TW | 201316893 | 4/2013 |

OTHER PUBLICATIONS

Office Action issued in corresponding Taiwan patent application dated Feb. 2, 2017.

*Primary Examiner* — Hoa C Nguyen
*Assistant Examiner* — Christopher L Augustin
(74) *Attorney, Agent, or Firm* — McClure, Qualey & Rodack, LLP

(57) ABSTRACT

A circuit board assembly includes a main board, a daughter board, a metal bracket, and a conductive gasket. The daughter board includes a circuit board and an electronic module with a plurality of pins connected to the circuit board. The metal bracket clamps at one side of the circuit board and the electronic module to shield the plurality of pins. The metal bracket has a connection part connecting the main board. The conductive gasket is disposed between the metal bracket and the plurality of pins.

11 Claims, 7 Drawing Sheets

(56) References Cited

U.S. PATENT DOCUMENTS

| | | | | |
|---|---|---|---|---|
| 6,005,186 | A * | 12/1999 | Bachman | H01R 13/65802 174/353 |
| 6,780,053 | B1 * | 8/2004 | Yunker | G02B 6/4201 439/607.2 |
| 6,804,112 | B2 | 10/2004 | Klimke et al. | |
| 6,986,679 | B1 * | 1/2006 | Aronson | H01R 25/00 439/170 |
| 7,390,193 | B2 | 6/2008 | Hsieh | |
| 7,463,495 | B2 * | 12/2008 | Tanaka | H05K 7/12 174/520 |
| 2002/0046850 | A1 * | 4/2002 | Onoue | H05K 7/2039 174/377 |
| 2006/0292931 | A1 * | 12/2006 | Tokuda | H05K 9/006 439/607.01 |
| 2008/0068114 | A1 * | 3/2008 | Inaba | H05K 9/006 334/85 |
| 2009/0211800 | A1 * | 8/2009 | Tsao | H05K 9/006 174/377 |
| 2009/0242264 | A1 * | 10/2009 | Lei | H05K 9/0032 174/382 |
| 2009/0251867 | A1 * | 10/2009 | Sharma | H04Q 1/08 361/737 |
| 2011/0281468 | A1 * | 11/2011 | Yu | H01R 13/6582 439/660 |
| 2011/0306242 | A1 * | 12/2011 | Zhang | H01R 13/6658 439/607.01 |
| 2013/0114180 | A1 * | 5/2013 | Le Foulgoc | H05K 1/0218 361/220 |
| 2015/0090486 | A1 * | 4/2015 | Cook | H05K 9/0015 174/356 |

* cited by examiner

CIRCUIT BOARD ASSEMBLY

CROSS-REFERENCE TO RELATED APPLICATIONS

This Non-provisional application claims priority of application No. 105100531 filed in Taiwan on Jan. 8, 2016 under 35 U.S.C. § 119, the entire contents of which are hereby incorporated by reference.

BACKGROUND OF THE INVENTION

1. Technology Field

The invention generally relates to a circuit board assembly. Particularly, the invention relates to a circuit board assembly with a metal bracket.

2. Description of the Prior Art

Conventional printed circuit boards generally include a main board and a plurality of daughter boards which are usually disposed with functional electronic modules. However, pins of the electronic module are relatively long and generally exposed that easily forms signal radiation to cause electromagnetic interference. Moreover, the ground connection between the main board and the daughter boards is required and complicated.

SUMMARY

On object of the invention is to provide a circuit board assembly which utilizes a metal bracket to shield the electromagnetic interference and to connect the main board and the daughter board.

Another object of the invention is to provide a circuit board assembly which utilizes a metal bracket to shield the electromagnetic interference and to enhance the ground connection between the main board and the daughter board.

In an embodiment, the invention provides a circuit board assembly, which includes a main board, a daughter board, a metal bracket, and a conductive gasket. The daughter board includes a circuit board and an electronic module. The electronic module has a plurality of pins connected to the circuit board. The metal bracket clamps at one side of the circuit board and the electronic module to shield the plurality of pins. The metal bracket has a connection part connecting the main board. The conductive gasket is disposed between the metal bracket and the plurality of pins.

In an embodiment, the metal bracket includes a shielding plate, a first clamping portion, and a second clamping portion. The first clamping portion and the second clamping portion respectively extend from opposite sides of the shielding plate toward a same direction to clamp the electronic module and the circuit board. The first clamping portion includes a plurality of fingers elastically contacting the electronic module.

In an embodiment, the circuit board has a grounding part, and the metal bracket has a contact part electrically connected to the grounding part of the circuit board. In an embodiment, the contact part is formed by bending a portion of the second clamping portion.

In an embodiment, the connection part extends from a portion of the second clamping portion and parallel to the shielding plate.

In an embodiment, the metal bracket further includes an extension part extending from the shielding plate and on one side of the first clamping portion and the second clamping portion.

In an embodiment, the circuit board assembly further includes an insulation film disposed at the second clamping portion and located between the second clamping portion and the circuit board.

In an embodiment, the circuit board assembly further includes a conductive film disposed at the electronic module and located between the electronic module and the plurality of fingers.

In an embodiment, the conductive gasket includes an insulation foam and a conductive cloth wrapping around the insulation foam.

In an embodiment, the plurality of pins are bent to connect the circuit board, and the conductive gasket has a bent surface corresponding to the plurality of pins that is bent.

In an embodiment, the circuit board assembly further includes an insulation tape attached to the plurality of pins and located between the conductive gasket and the plurality of pins.

In an embodiment, the circuit board has a first side and a second side; the plurality of pins penetrates the circuit board from the first side to the second side and distal ends of the plurality of the pins are located on the second side; the insulation tape is attached to the second side of the circuit board to cover the distal ends of the plurality of pins.

DETAILED DESCRIPTION OF THE PREFERRED EMBODIMENT

The invention provides a circuit board assembly, particularly a circuit board assembly with a metal bracket. In the embodiments of the invention, the circuit board assembly can be applied to an electronic device having multiple circuit boards connected together, particularly to an electronic device having circuit boards with exposed pins which require the electromagnetic radiation shielding, but not limited thereto. For example, the circuit board assembly can be applied to the cable modem, video converter (or set-top box (STB)), etc. Hereinafter, embodiments of the circuit board assembly of the invention will be described in detail with reference to the drawings.

Figure 1A:
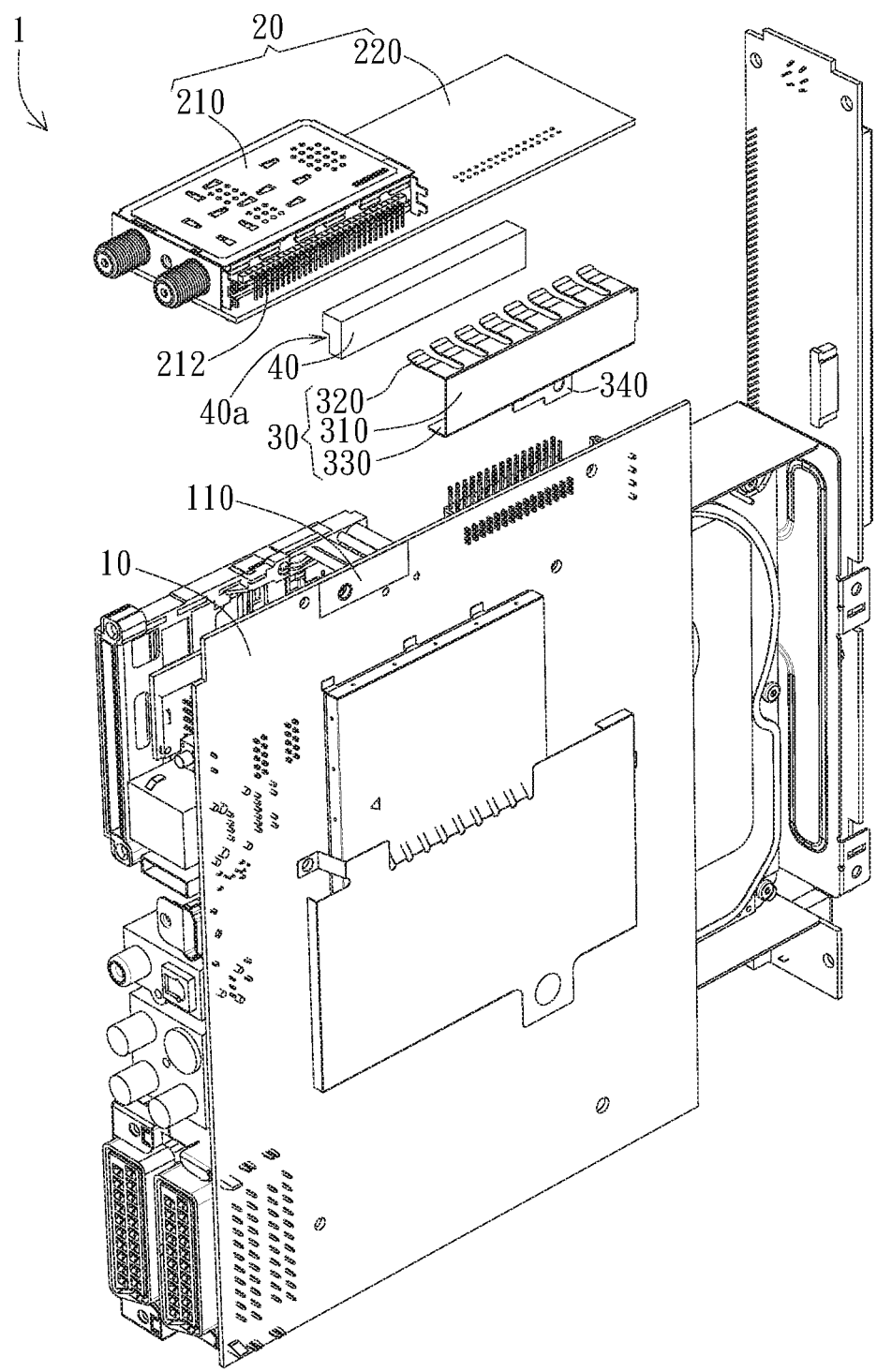
FIGS. 1A to 1C are respectively an exploded view, a partial assembled view, and a cross-sectional view of the circuit board assembly in an embodiment of the invention.
Figure 1B:
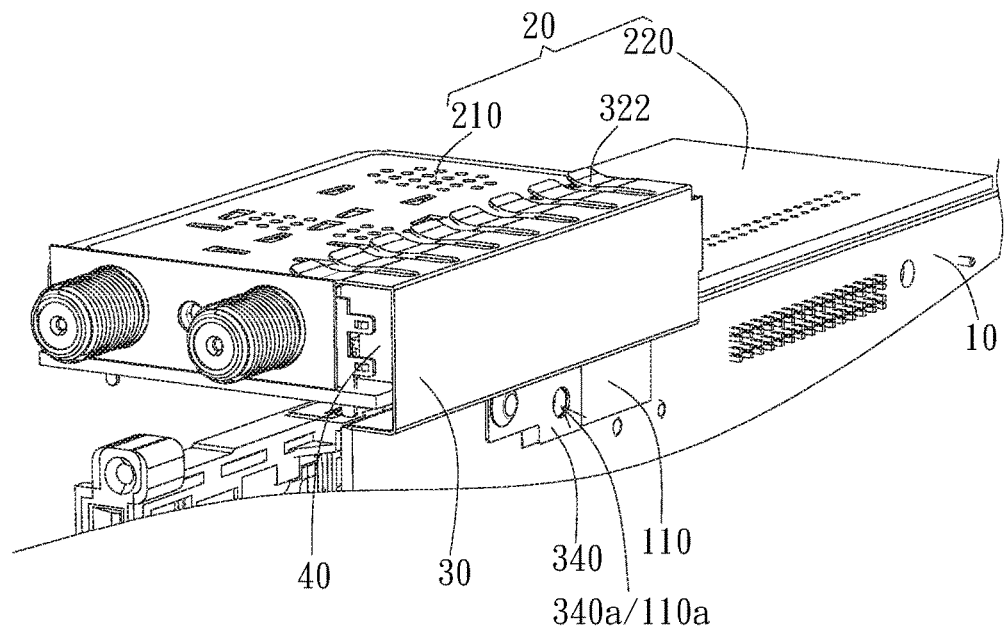
Figure 1C:
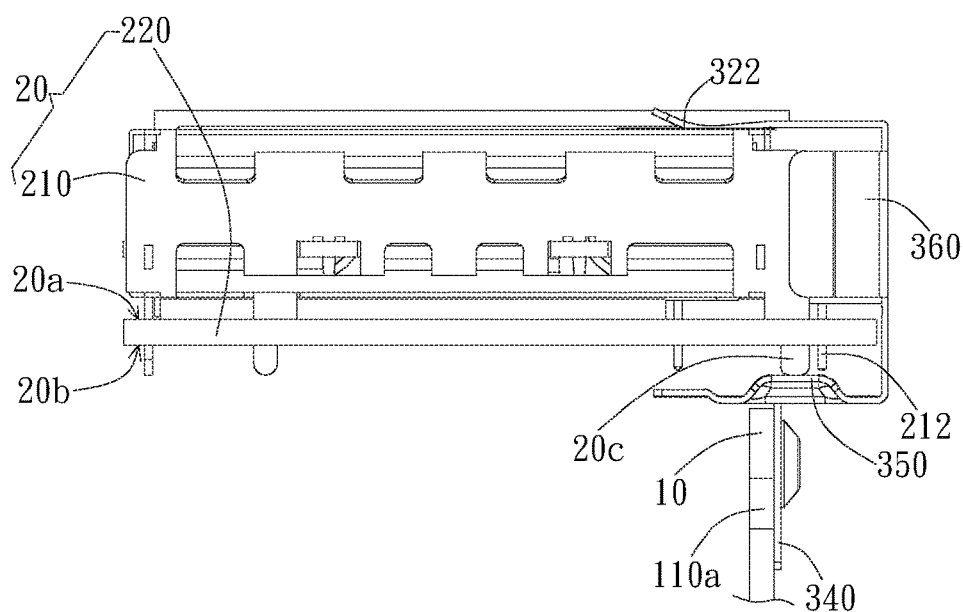

As shown in FIGS. 1A to 1C, in an embodiment, the circuit board assembly 1 of the invention includes a main board 10, a daughter board 20, a metal bracket 30, and a conductive gasket 40. The daughter board 20 includes a circuit board 220 and an electronic module 210, wherein the electronic module 210 has a plurality of pins 212 connected to the circuit board 220. The metal bracket 30 clamps at one side of the circuit board 220 and the electronic module 210 to shield the plurality of pins 212. The metal bracket 30 has a connection part 340 for connecting the main board 10. The conductive gasket 40 is disposed between the metal bracket 30 and the plurality of pins 212.

In this embodiment, the main board 10 can be a system circuit board of the electronic device, and the daughter board 20 can be a circuit board equipped with the electronic module 210 to achieve a specific function, but not limited thereto. In another embodiment, the main board 10 and the daughter board 20 can be any two circuit boards required connection in the electronic device, and the main board 10 has a coupling part 110 for connecting the metal bracket 30. The coupling part 110 is preferably a ground point of the main board 10, such as the ground area on the backside of the main board 10, so that the metal bracket 30 is not only physically connected to the main board 10, but also electrically connected to the ground of the main board 10. In this embodiment, the daughter board 20 can be a tuner module circuit board with an integrated tuner function, wherein the electronic module 210 is a tuner module, and the plurality of pins 212 extend horizontally from one side of the electronic module 210 and are bent downward to connect the circuit board 220. Specifically, the circuit board 220 has a first side 20a and a second side 20b. The plurality of pins 212 penetrate the circuit board 220 from the first side 20a to the second side 20b so that distal ends of the plurality of the pins 212 are located on the second side 20b (see FIG. 1C). In this embodiment, the plurality of pins 212 are signal pins for transferring signals, and the plurality of pins 212 are arranged parallel to one another. Moreover, the electronic module 210 preferably has a metal casing, so that the top surface of the electronic module 210 can serve as the grounding part. In addition, the second side 20b of the circuit board 220 has a grounding part 20c, wherein the grounding part 20c is preferably disposed proximate to the distal ends of the pins 212 for electrically connecting the metal bracket 30.

Figure 3:
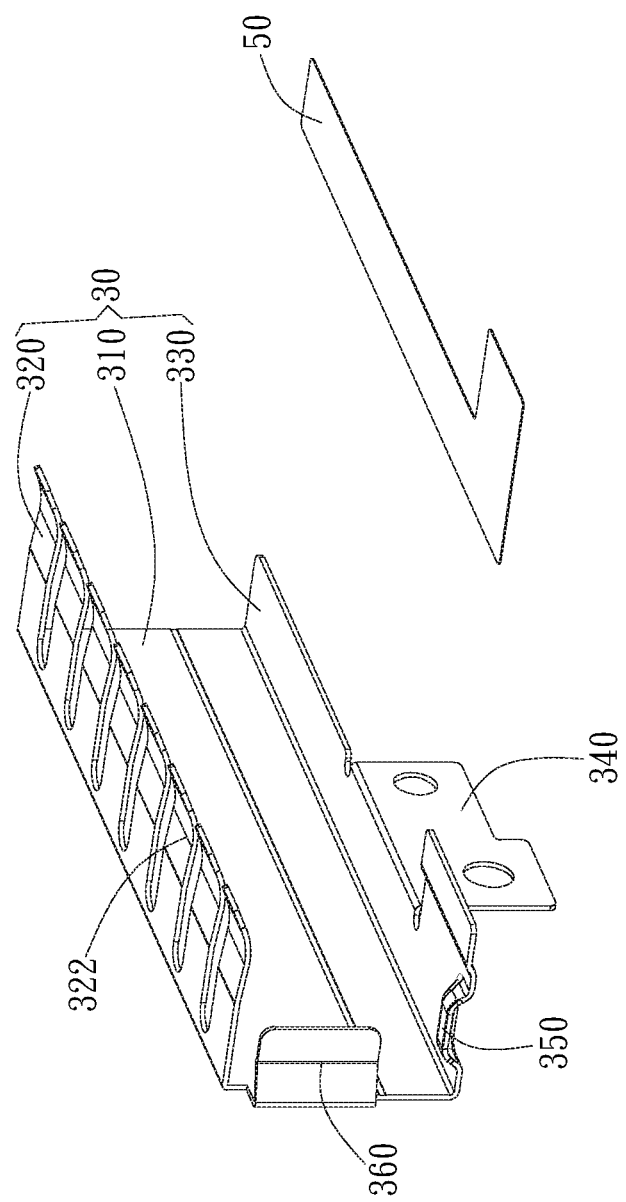
FIG. 3 is a schematic view of the metal bracket and the insulation film of the circuit board assembly in an embodiment of the invention.

Referring to FIG. 1A and FIG. 3, in an embodiment, the metal bracket 30 includes a shielding plate 310, a first clamping portion 320, and a second clamping portion 330. The first clamping portion 320 and the second clamping portion 330 respectively extend from opposite sides of the shielding plate 310 toward a same direction to clamp the electronic module 210 and the circuit board 220 therebetween. Particularly, the shielding plate 310 substantially extend on one side of the circuit board 220 and the electronic module 210, so that the shielding plate 310 shields on the side of the plurality of pins 212 and covers the plurality of pins 212 along the disposing direction of the pins 212. The first clamping portion 320 and the second clamping portion 330 are substantially horizontally extended from the upper side and the lower side of the shielding plate 310, respectively, so that the metal bracket 30 has a cross section similar to the shape of "U". In this embodiment, the first clamping portion 320 preferably includes a plurality of fingers 322 for elastically contacting the top surface of the electronic module 210. Specifically, the first clamping portion 320 is constructed by the plurality of fingers 322, wherein each finger 322 is disposed apart along the upper side of the shielding plate 310 and extends substantially horizontally away from the shielding plate 310. The distal end (or free end) of each finger 322 preferably is bent upward to form as a spring leaf. As such, when the metal bracket 30 clamps at the side of the electronic module 210 and the circuit board 220, the clamping effect of the metal bracket 30 can be enhanced by means of the elastic fingers 322. It is noted that in the drawing, the fingers 322 are illustrated to separately connect the upper side of the shielding plate 310, but not limited thereto. In another embodiment, the fingers 322 can be connected together at one side to form a connection piece and the fingers 322 are connected to the shielding plate 310 by connecting the connection piece to the upper side of the shielding plate 310.

In this embodiment, the second clamping portion 330 is a sheet-like clamping portion, but not limited thereto. In another embodiment, the second clamping portion 330 can be designed with fingers similar to the fingers 322 of the first clamping portion 320. Moreover, the connection part 340 preferably extends from a portion of the second clamping portion 330 and parallel to the shielding plate 310. Particularly, the connection part 340 has a plate form for flatly attaching the coupling part 110 of the main board 10 to construct the grounding connection between the daughter board 20 and the main board 10. In this embodiment, the connection part 340 is preferably formed with a coupling hole 340a, and the coupling part 110 of the main board 10 has a corresponding hole 110a, so that a screw or a bolt is secured to the coupling hole 340a and the hole 110a to connect the metal bracket 30 and the main board 10, and the daughter board 20 can be detachably connected to the main board 10 (as shown in FIG. 1B), but not limited thereto. In another embodiment, the connection part 340 and the coupling part 110 of the main board 10 can be connected by welding, adhering, etc., so that the metal bracket 30 is physically and electrically connected to the main board 10.

Moreover, the metal bracket 30 further has a contact part 350 for electrically connecting the grounding part 20c of the circuit board 220. In this embodiment, the contact part 350 is formed by bending a portion of the second clamping portion 330. Specifically, the portion of the second clamping portion 330 is bent to protrude toward the first clamping portion 320 to form the contact part 350 that corresponds to the grounding part 20c of the circuit board 220.

In an embodiment, the metal bracket 30 further includes an extension part 360. The extension part 360 extends from the shielding plate 310 at one side of the first clamping portion 320 and the second clamping portion 330. Specifically, the extension part 360 extends from the side of the shielding plate 310 toward the same direction as the first clamping portion 320 and the second clamping portion 330, so that the extension part 360 at least partially shields another side of the plurality of the pins 212, e.g. the side of the outmost pin 212 disposed along the disposing direction.

In an embodiment, the conductive gasket 40 includes an insulation foam 410 and a conductive cloth 420 (see FIG. 2A), wherein the insulation foam 410 is wrapped in the conductive cloth 420. Particularly, the conductive cloth 420 can substantially cover the entire insulation foam 410 or at least cover the surface of the insulation foam that corresponds to the metal bracket 30, such as the surfaces facing the shielding plate 310, the first clamping portion 320, and the second clamping portion 330. The conductive gasket 40 is preferably deformable, so that when the metal bracket 30 clamps at the side of the electronic module 210 and the circuit board 220, the conductive gasket 40 fills the gap between the plurality of pins 212 and the metal bracket 30 to further suppress the signal radiation from the plurality of pins 212. In addition, corresponding to the bending shape of the plurality of the pins 212, the conductive gasket 40 preferably has a bent surface 40a corresponding to the plurality of bent pins 212.

Figure 2A:
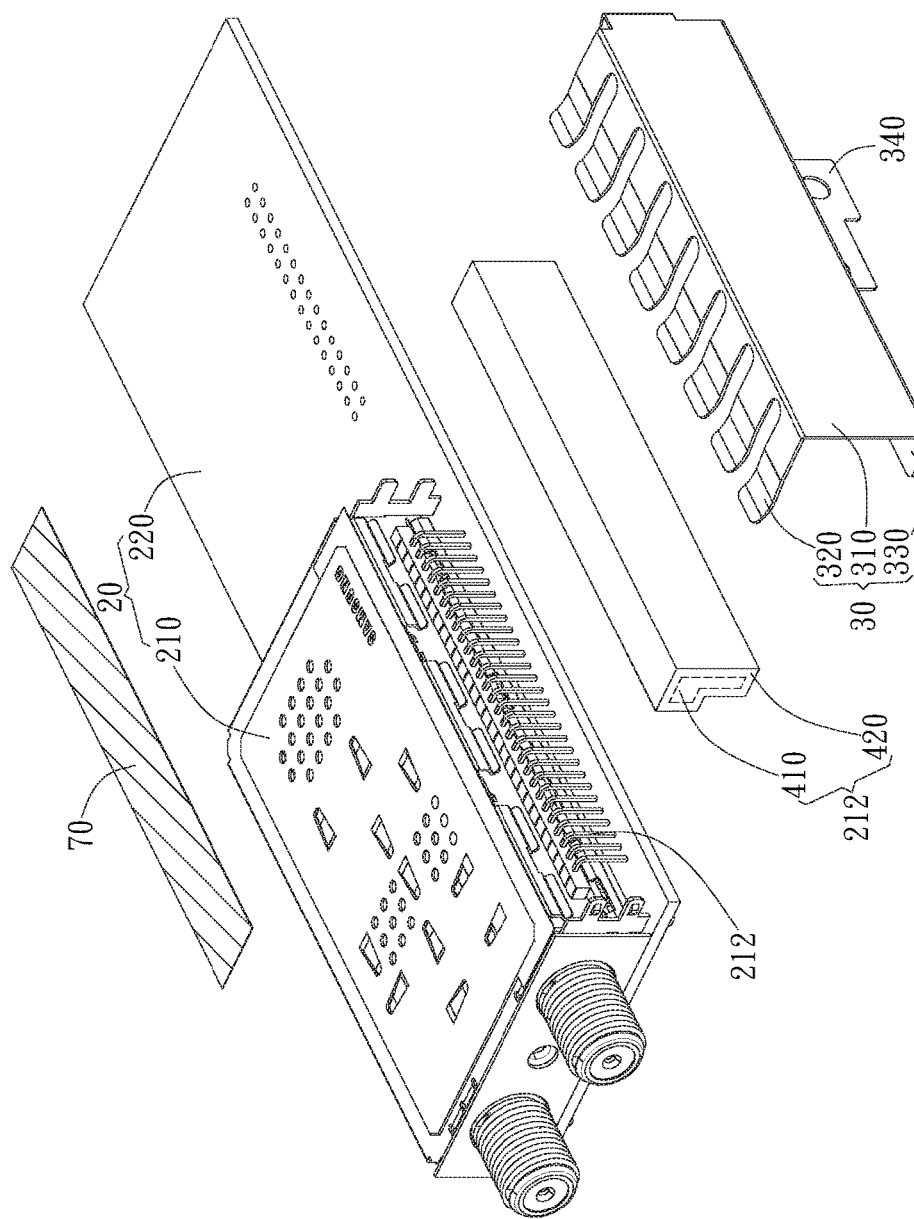
FIGS. 2A and 2B are schematic views of the circuit board assembly in another embodiment of the invention.
Figure 2B:
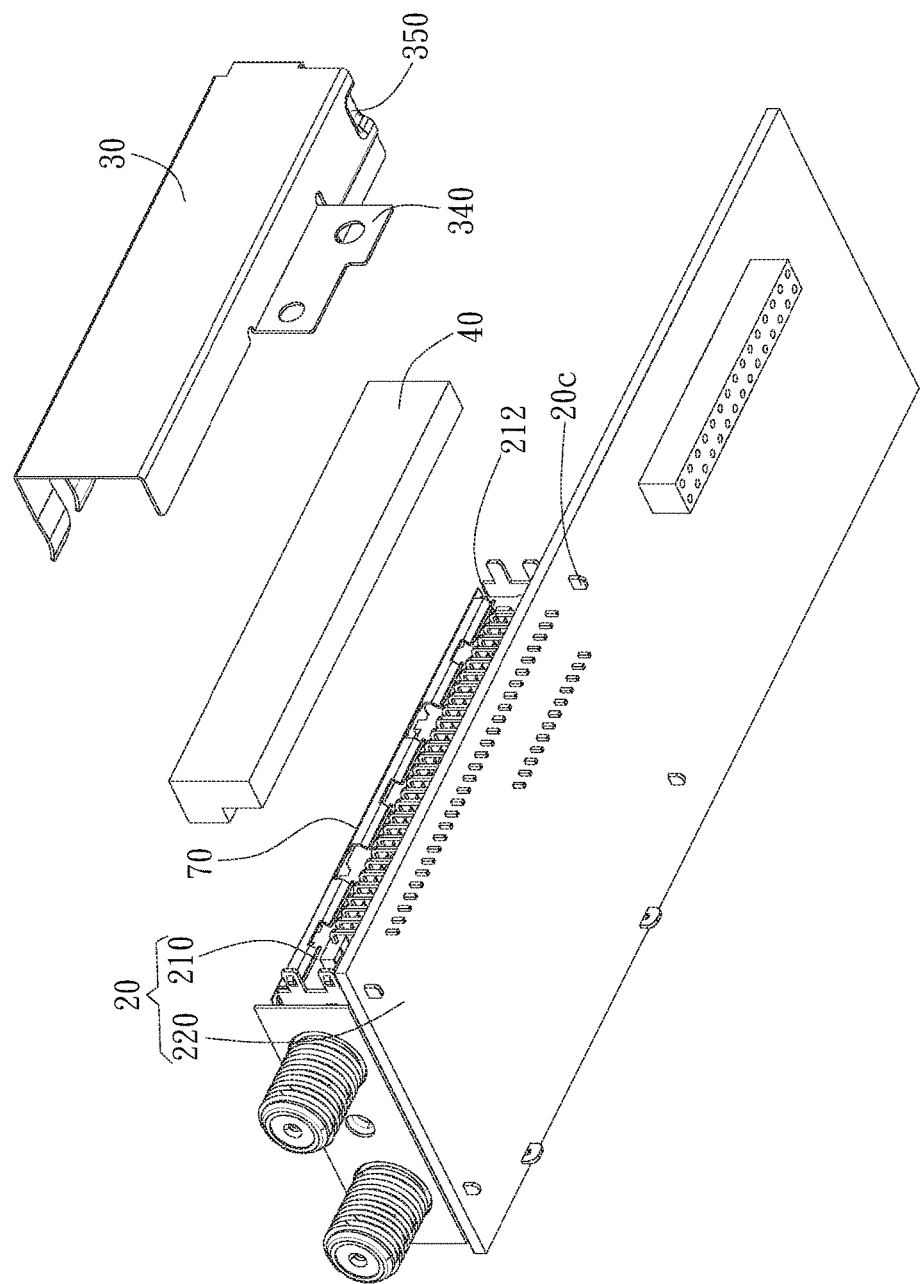

In another embodiment, shown in FIGS. 2A and 2B, the circuit board assembly further includes a conductive film 70, wherein the conductive film 70 is disposed at the electronic module 210 and located between the electronic module 210 and the first clamping portion 320. Specifically, the conductive film 70 can be embodied as a conductive cloth or any suitable conductive filler so as to enhance the connection tightness between the electronic module 210 and the first clamping portion 320 (i.e. the plurality of fingers 322).

In another embodiment, as shown in FIG. 3, the circuit board assembly further includes an insulation film 50, wherein the insulation film 50 is disposed at the second clamping portion 330 and located between the second clamping portion 330 and the circuit board 220. Specifically, the insulation film 50 can be an insulation tape or any suitable insulation material. The insulation film 50 is preferably disposed at a location corresponding to the distal ends of the pins 212 that extend out on the second side 20b of the circuit board 220, so that the plurality of pins 212 will not directly contact the metal bracket 30.

Figure 4:
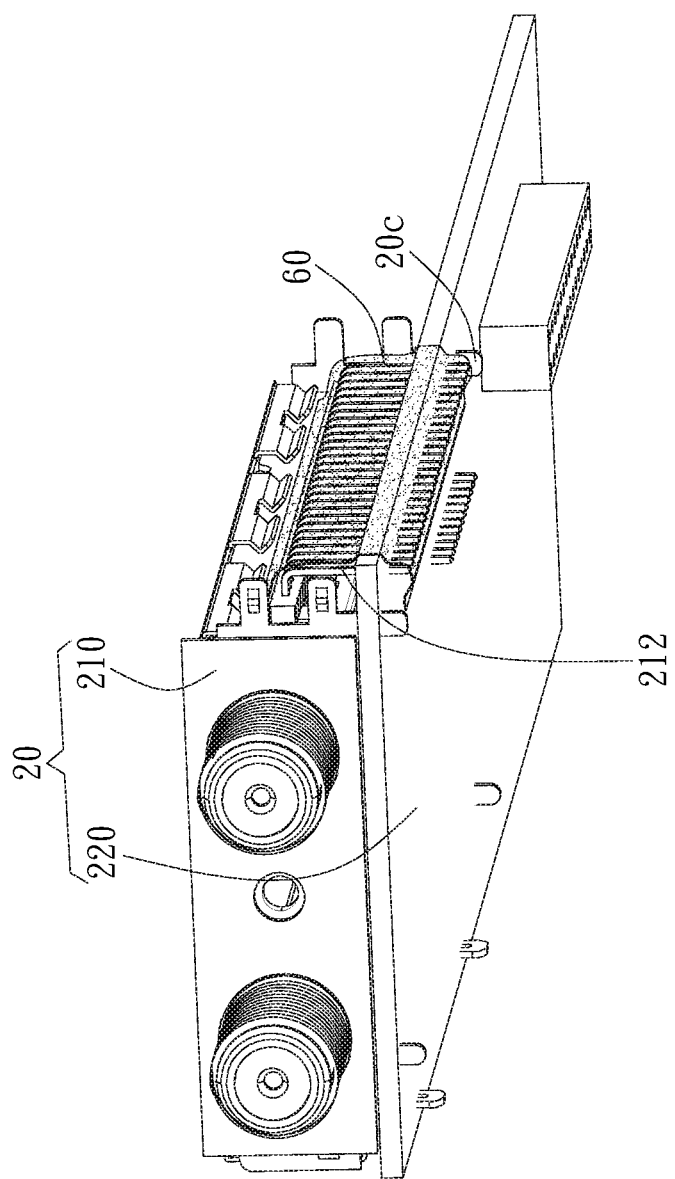
FIG. 4 is a schematic view of the daughter board and the insulation tape of the circuit board assembly in another embodiment of the invention.

In another embodiment, as shown in FIG. 4, the circuit board assembly further includes an insulation tape 60, wherein the insulation tape 60 is attached to the plurality of pins 212 and located between the conductive gasket 40 and the plurality of pins 212. Moreover, the insulation tape 60 preferably extends to the second side 20b of the circuit board 220 to cover the distal ends of the plurality of pins 212. That is, the circuit board assembly can prevent the plurality of pins 212 from directly contacting the metal bracket 30 by the insulation film 50, the insulation tape 60, or the combination thereof.

Figure 5:
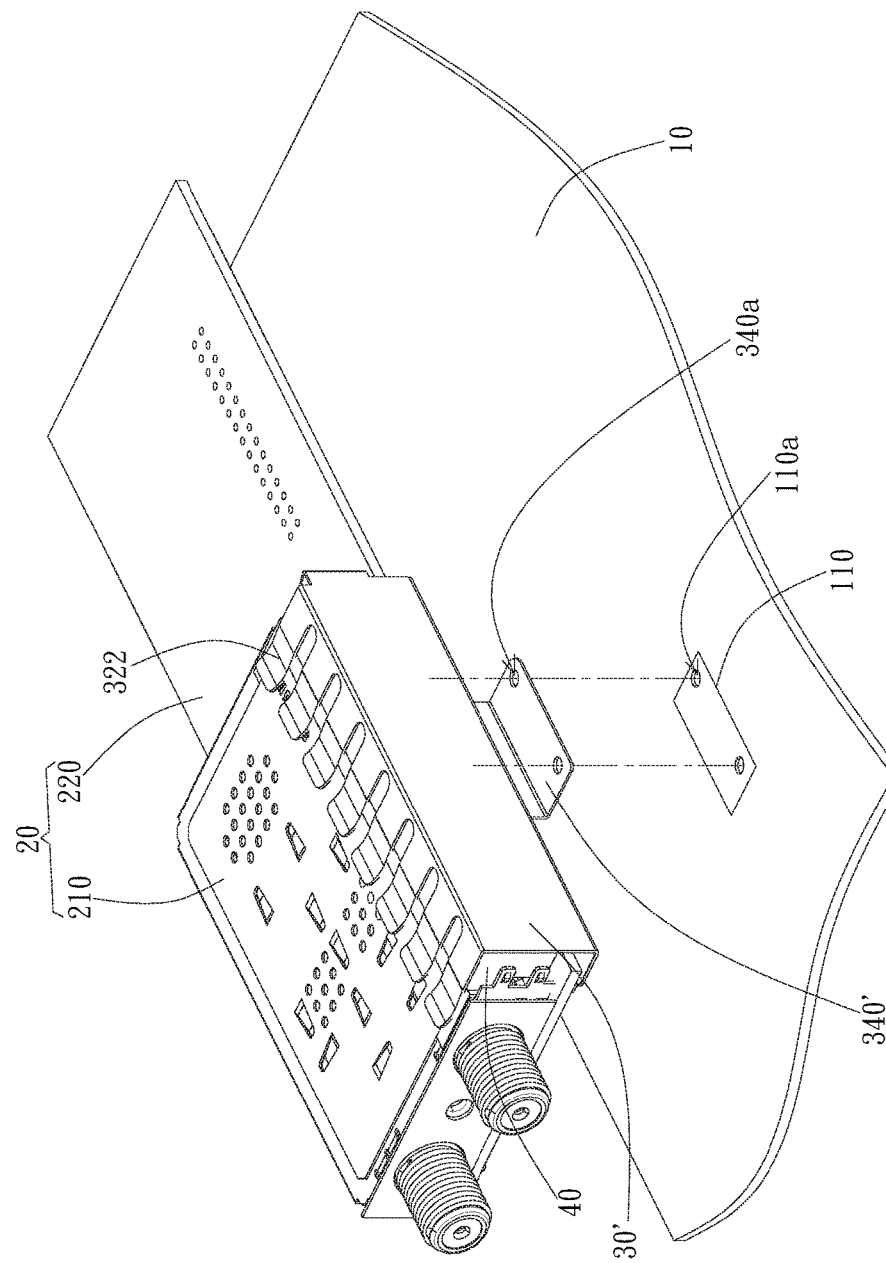
FIG. 5 is a schematic view of the circuit board assembly in another embodiment of the invention.

As shown in FIGS. 1B and 1C, the metal bracket 30 clamps at one side of the circuit board 220 and the electronic module 210, and the connection part 340 extends downwardly to connect the coupling part 110 of the main board 10, so that the daughter board 20 and the main board 10 construct an "L-shaped" connection, but not limited thereto. In another embodiment, as shown in FIG. 5, by modifying the design of the connection part 340' of the metal bracket 30, the daughter board 20 and the main board 10 can be connected in parallel manner.

Compared to the prior art, the circuit board assembly of the invention utilizes the metal bracket to shield the plurality of pins of the electronic module, so that the signal radiation from the pins can be effectively suppressed and the electromagnetic interference can be reduced. Moreover, the circuit board assembly of the invention utilizes the metal bracket to not only physically connect the daughter board and the main bard, but also form the electrical ground connection among the electronic module, the circuit board of the daughter board, and the main board, so that the stability of the ground connection and the structural connection can be enhanced.

Although the preferred embodiments of the present invention have been described herein, the above description is merely illustrative. The preferred embodiments disclosed will not limit the scope of the present invention. Further modification of the invention herein disclosed will occur to those skilled in the respective arts and all such modifications are deemed to be within the scope of the invention as defined by the appended claims.

What is claimed is:

1. A circuit board assembly, comprising:
a main board;
a daughter board comprising a circuit board and an electronic module, the electronic module having a plurality of pins connected to the circuit board;
a metal bracket clamping at one side of the circuit board and the electronic module to shield the plurality of pins, the metal bracket having a connection part connecting the main board, wherein the metal bracket comprises a shielding plate, a first clamping portion, and a second clamping portion; the first clamping portion and the second clamping portion respectively extend from opposite sides of the shielding plate toward a same direction to clamp the electronic module and the circuit board; the first clamping portion comprises a plurality of fingers elastically contacting the electronic module; and
a conductive gasket disposed between the metal bracket and the plurality of pins.

2. The circuit board assembly of claim 1, wherein the circuit board has a grounding part; the metal bracket has a contact part electrically connected to the grounding part of the circuit board.

3. The circuit board assembly of claim 2, wherein the contact part is formed by bending a portion of the second clamping portion.

4. The circuit board assembly of claim 1, wherein the connection part extends from a portion of the second clamping portion and parallel to the shielding plate.

5. The circuit board assembly of claim 1, wherein the metal bracket further comprises an extension part extending from the shielding plate and on one side of the first clamping portion and the second clamping portion.

6. The circuit board assembly of claim 1, further comprising an insulation film disposed at the second clamping portion and located between the second clamping portion and the circuit board.

7. The circuit board assembly of claim 1, further comprising a conductive film disposed at the electronic module and located between the electronic module and the plurality of fingers.

8. The circuit board assembly of claim 1, wherein the conductive gasket comprises an insulation foam and a conductive cloth wrapping around the insulation foam.

9. The circuit board assembly of claim 1, wherein the plurality of pins are bent to connect the circuit board, and the conductive gasket has a bent surface corresponding to the plurality of pins that is bent.

10. The circuit board assembly of claim 1, further comprising an insulation tape attached to the plurality of pins and located between the conductive gasket and the plurality of pins.

11. The circuit board assembly of claim 10, wherein the circuit board has a first side and a second side; the plurality of pins penetrates the circuit board from the first side to the second side and distal ends of the plurality of the pins are located on the second side; the insulation tape is attached to the second side of the circuit board to cover the distal ends of the plurality of pins.

* * * * *